United States Patent [19]

de Korte

[11] 4,337,440

[45] Jun. 29, 1982

[54] ELECTRONIC CASCADE CIRCUIT COMPRISING A CIRCUIT HAVING CONTROLLABLE TRANSFER CHARACTERISTICS AND A TWO-PORT

[75] Inventor: Jacob de Korte, Breukelen, Netherlands

[73] Assignee: Nederlandse Omroep Stichting, Hilversum, Netherlands

[21] Appl. No.: 127,362

[22] Filed: Mar. 5, 1980

[30] Foreign Application Priority Data

Mar. 7, 1979 [NL] Netherlands .......................... 7901843

[51] Int. Cl.³ .............................................. H03G 3/20
[52] U.S. Cl. ...................................... 330/129; 330/51; 333/14
[58] Field of Search .......................... 330/51, 129, 136; 333/14

[56] References Cited

U.S. PATENT DOCUMENTS 2,923,887  2/1960  Aiken .................................... 333/14
4,218,662  8/1980  Schroder .............................. 330/51

Primary Examiner—Michael J. Tokar
Attorney, Agent, or Firm—Irvin A. Lavine

[57] ABSTRACT

An electronic circuit comprising, in cascade, a two-port having an input terminal and an output terminal, and a controllable transfer circuit comprising an input terminal, an output terminal, and an external control terminal, there being provided a switching means having a parent contact and two switching contacts. The parent contact is connected to the control terminal, the first switching contact to the output terminal of the two-port, and the second switching contact to the input terminal of the two-port, and a through-connection is provided between the output terminal of the two-port and the input terminal of the controllable transfer circuit.

4 Claims, 4 Drawing Figures

ELECTRONIC CASCADE CIRCUIT COMPRISING A CIRCUIT HAVING CONTROLLABLE TRANSFER CHARACTERISTICS AND A TWO-PORT

This invention relates to an electronic circuit comprising, in cascade, a two-port having an input terminal and an output terminal, and a circuit having controllable transfer characteristics, which transfer characteristics are uniquely related to a signal of controllable magnitude to be supplied to a control input of the circuit, and comprising an input terminal and an output terminal, the input terminal of the two-port forming the input terminal of the electronic circuit, and the output terminal of the circuit having controllable transfer characteristics forming the output terminal of the electronic circuit.

In the application of a circuit comprising a two-port, such as for example a correction filter, connected in cascade to a circuit having controllable transfer characteristics, such as for example a compressor circuit, it is often desirable for the two-port to be included, at choice, upstream or downstream with respect to the circuit having controllable transfer characteristics.

A disadvantage of prior art circuits having controllable transfer characteristics is that the control input is internally already connected either to the input or the output of the transfer circuit, so that these circuits have the configuration of a two-port. If now such a circuit having controllable transfer characteristics is connected in cascade to another two-port, and it is desirable for the two-port to be included, at choice, either upstream, or downstream of the circuit having controllable transfer characteristics, this requires a large number of switching means. This involves complicated wiring, high costs of production, and a relatively high vulnerability.

It is accordingly an object of the present invention to provide the possibility for a two-port, connected in cascade to a second circuit having controllable transfer characteristics, to be connected at choice upstream or downstream of the circuit having controllable transfer characteristics.

The invention is based on the concept that when a two-part circuit is connected in cascade with the second circuit, the sequence of the two-part circuit has no effect on the transfer characteristics of the second circuit as a whole. If, however, one of these circuits has controllable transfer characteristics, it is of importance for the total transfer characteristics of the circuits to be dependent upon the magnitude of a control signal applied to a control terminal of the second circuit; in prior circuits having controllable transfer characteristics, these characteristics are dependent instead on the sequence of connection of the first and second circuits, as already described.

The invention is characterized in that the circuit having controllable transfer characteristics comprises an external terminal for the supply of a signal to which the control magnitude is uniquely related, and which comprises a switching means including a parent contact and two switching contacts, the parent contact being connected to the control terminal, the first switching contact to the output terminal of the two-port, and the second switching contact to the input terminal of the two-port, there being provided a through-connection between the output terminal of the two-port and the input terminal of the circuit having controllable transfer characteristics.

One embodiment of the invention will now be described, by way of example, with reference to the accompanying drawings, in which.

Figure 1:
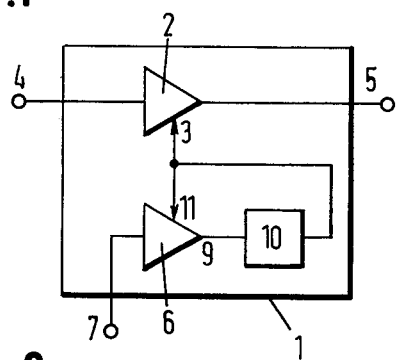
FIG. 1 shows a block diagram of a three-port having controllable transfer characteristics.

FIG. 1 shows a block diagram of a compressor three-port 1 having an input terminal 7 which performs the function of a control terminal for the three-port 1, which through a rectifying circuit 6 applies an unipolar control voltage to control input 3. The input and output terminal of the three-port are formed by the input and output terminal 4 and 5, respectively, of controllable amplifier 2.

It is often desirable to connect in cascade with this compressor three-port 1 a two-port in the form of a pre-emphasis circuit, a delay line, a correction network, or the like. In such a situation it is also desirable for the two-port to be selectively included upstream or downstream of the compressor circuit.

Figure 2:
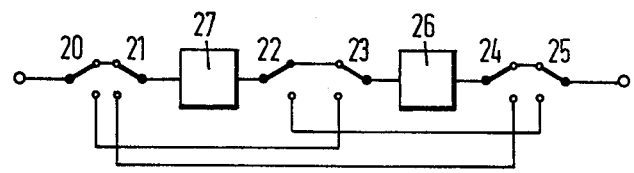
FIG. 2 shows a block diagram of a cascade arrangement of a two-port having controllable transfer characteristics and a second two-port having the switching facilities according to the prior.

FIG. 2 shows the circuitry required to perform this change of order if the control terminal of the compressor circuit is fixedly connected to the input terminal 4 thereof, as has hitherto been conventional. The requires changing the order of compressor circuit 26 and two-port 27 by means of six switching means 20–25.

Figure 3:
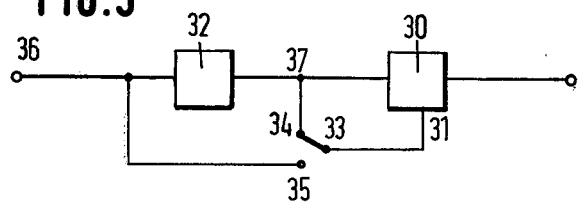
FIG. 3 shows a block diagram of a cascade arrangement including a two-port and a three-port having one switching means, in accordance with the present invention.

FIG. 3 shows a cascade connection in accordance with the present invention, in which compressor 30 is formed with an externally accessible control terminal 31. For changing the order of two-port 32 and compressor circuit 30, it is now only necessary to provide one switching means with a parent contact 33 connected to control terminal 31, and two switching contacts 34 and 35, respectively connected to the output 37 and the input terminal 36 of the two-port. Through the operation of the switching means one of the two switching contacts can be connected to the control terminal 31 of the compressor circuit. In this connection it should be noted that the order of two-port 32 and three-port 30 has no effect on the total transfer of the circuit, but that the point from which the control magnitude is taken does affect the total transfer characteristics.

Figure 4:
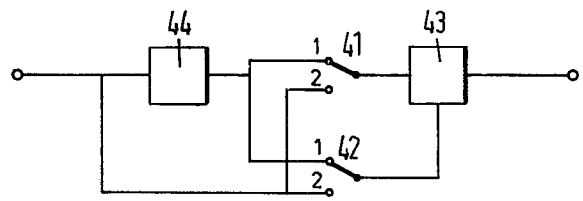
FIG. 4 shows a block diagram of a cascade arrangement including a two-port and a three-port having two switching means in accordance with the present invention.

FIG. 4 shows a more extensive arrangement according to the present invention, which comprises two switching means 41 and 42, each having a parent contact and two switching contacts, by means of which the connection between the compressor three-port 43 or any other suitable three-port, such as an expansion circuit, a noise port, a dynamic noise filter, and the like, and a two-port 44 can be selected in a highly universal manner. The manner in which this is effected will be described hereinafter.

If, as viewed in the drawings, the upper contact of both switching means 41 and 42 is designated by 1, and the lower contact by 2, there are the following four possible positions, and hence four different connections of the two-port with the three-port, indicated in the following table, the first column indicating the switching contact of switching means 41, which is connected to the parent contact, and the second column the switching contact of switching means 42, connected to the parent contact thereof.

1,1—circuit 43 connected in cascade to circuit 44, the control magnitude being taken from the output of circuit 44

1,2—similar to 1,1 but the control magnitude is taken from the input of circuit 44

2,1—the input of circuit 43 is the input of the total arrangement, the output of circuit 43 is the output of the total arrangement, and the two-port is included in the connection between the input and the control terminal of the three-port

2,2—only circuit 43 is operative.

Accordingly, the use of the circuit arrangement according to the present invention enables the realization of desirable transfer functions using only one or two switching means, which hitherto could only be effected by means of a much larger number of switching means.

I claim:

1. An electronic circuit arrangement comprising, in cascade connection:
    (a) a first two-port circuit having a first input terminal and a first output terminal;
    (b) a second circuit having a second input terminal, an external control terminal and a second output terminal, said second circuit responsive to a control signal applied to its control terminal for controllably varying its transfer characteristics;
    (c) said first input terminal comprising an input terminal of said electronic circuit arrangement, and said second output terminal comprising an output terminal of said electronic circuit arrangement;
    (d) switching means having a parent contact and first and second switching contacts, said parent contact being connected to said control terminal, said second switching contact being connected to said first input terminal; and
    (e) means for providing a connection between said first output terminal and said second input terminal, and said first switching contact.

2. An electronic circuit arrangement comprising in cascade connection:
    (a) a first two-port circuit having a first input terminal and a first output terminal;
    (b) a second circuit having a second input terminal, an external control terminal and a second output terminal, said second circuit responsive to a control signal applied to its control terminal controllably varying its transfer characteristics;
    (c) said first input terminal comprising an input terminal of said electronic circuit arrangement, and said second output terminal comprising an output terminal of said electronic circuit arrangement;
    (d) first switching means having a first parent contact and first and second switching contacts, said first parent contact being connected to said control terminal, and said second switching contact being connected to said first input terminal;
    (e) means for connecting said first switching contact to said first output terminal; and
    (f) second switching means having a second parent contact and third and fourth switching contacts, said second parent contact being connected to said second input terminal, said third switching contact being connected to said first output terminal and said fourth switching contact being connected to said first input terminal.

3. An electronic circuit arrangement as claimed in claim 2, wherein each of said first and second switching means is disposable in a first position to interconnect its parent contact to said first and third switching contacts respectively, and in a second position to interconnect its parent contact to said second and fourth switching contacts respectively, whereby when said second switching means is disposed in its first position, said first output terminal is connected to said control terminal.

4. An electronic circuit as claimed in claim 3, wherein when said first and second switching means are disposed to their second positions, said second circuit is operationally disconnected from said first circuit.

* * * * *